United States Patent
Wolford et al.

(10) Patent No.: US 6,840,783 B2
(45) Date of Patent: Jan. 11, 2005

(54) PRESS-FIT BUS BAR DISTRIBUTING POWER

(75) Inventors: Gerald Wolford, Montreal (CA); James Mills, Brossard (CA); Steven E. Minich, York, PA (US); Christopher J. Kolivoski, York, PA (US); John D. Dodds, Hummelstown, PA (US); James R. Volstorf, Mechanicsburg, PA (US); Wilfred J. Swain, Mechanicsburg, PA (US); James S. Staron, Halifax, PA (US)

(73) Assignee: FCI Americas Technology, Inc., Reno, NV (US)

(*) Notice: Subject to any disclaimer, the term of this patent is extended or adjusted under 35 U.S.C. 154(b) by 0 days.

(21) Appl. No.: 10/242,145

(22) Filed: Sep. 11, 2002

(65) Prior Publication Data

US 2003/0096520 A1 May 22, 2003

(51) Int. Cl.[7] .............................................. H01R 25/00
(52) U.S. Cl. ........................ 439/110; 439/111; 439/115; 439/286; 439/295; 439/67; 439/77; 439/212; 174/149 R
(58) Field of Search ................................. 439/110, 111, 439/115, 286, 295, 67, 77, 212; 174/149 R

(56) References Cited

U.S. PATENT DOCUMENTS

| | | | |
|---|---|---|---|
| 3,662,088 A | | 5/1972 | Wright et al. ............. 174/72 B |
| 3,670,290 A | * | 6/1972 | Angele et al. .............. 439/325 |
| 4,245,135 A | | 1/1981 | Weiss .......................... 174/72 |
| 4,273,952 A | | 6/1981 | Weiss ....................... 174/68 B |
| 4,382,156 A | | 5/1983 | Jodoin ...................... 174/72 B |
| 4,721,471 A | | 1/1988 | Mueller ....................... 439/78 |
| 4,867,696 A | | 9/1989 | Demler, Jr. et al. ......... 439/212 |
| 4,871,315 A | * | 10/1989 | Noschese ..................... 439/67 |
| 5,645,445 A | * | 7/1997 | Siemon et al. ............. 439/395 |
| 6,238,225 B1 | * | 5/2001 | Middlehurst et al. ....... 439/212 |
| 6,276,966 B1 | * | 8/2001 | Yamoto et al. ............. 439/607 |

FOREIGN PATENT DOCUMENTS

| EP | 0028791 A1 | 5/1981 |
|---|---|---|
| GB | 2018054 A | 10/1979 |

* cited by examiner

*Primary Examiner*—Dean A. Reichard
*Assistant Examiner*—Jinhee Lee
(74) *Attorney, Agent, or Firm*—Harrington & Smith, LLP

(57) ABSTRACT

A press-fit bus-bar for distributing power along a backplane or a printed circuit board includes a number of flat bus bar conductors fabricated from an electrically conductive material. Each bus bar conductor is separated from adjacent bus bar conductors by layers of an insulating material. A number of electrically conductive press-fit tails protrude from one edge of each bus bar conductor. When the laminated bus bar conductors and insulating material layers are placed in a housing which is then filled with a hardened epoxy resin, the press-fit tails protrude from the surface of that epoxy resin. These protruding tails can be press-fit in a backplane(s) or printed circuit board(s) for the purpose of supplying these backplane(s) or printed circuit board(s) with electric power.

14 Claims, 8 Drawing Sheets

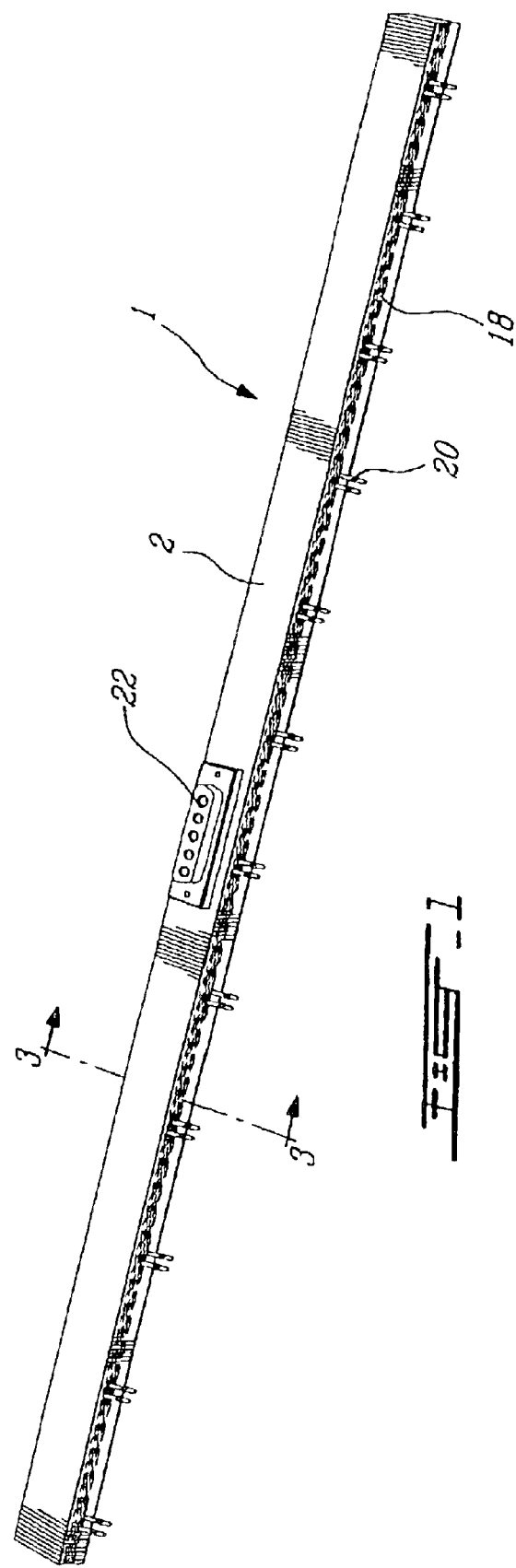

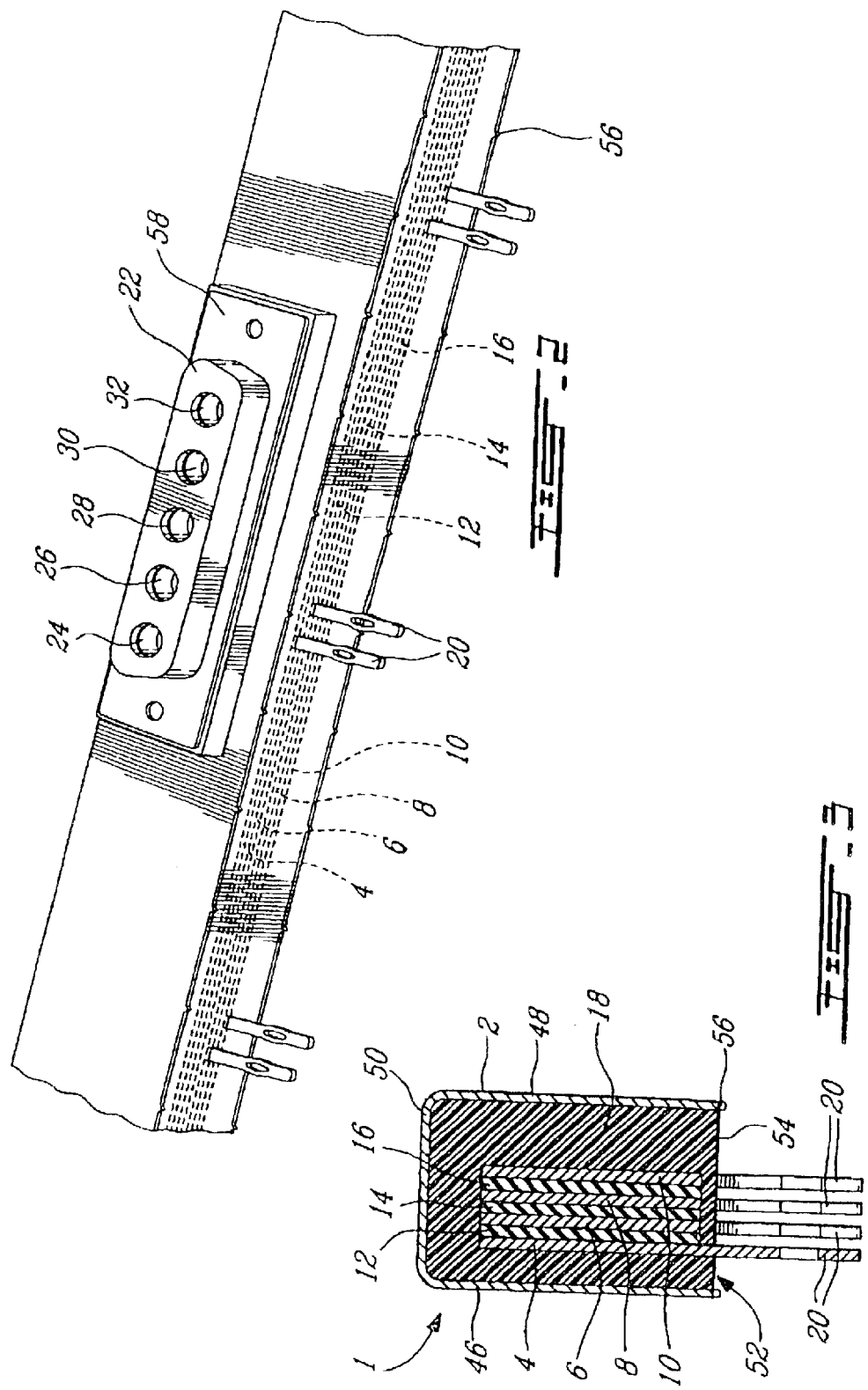

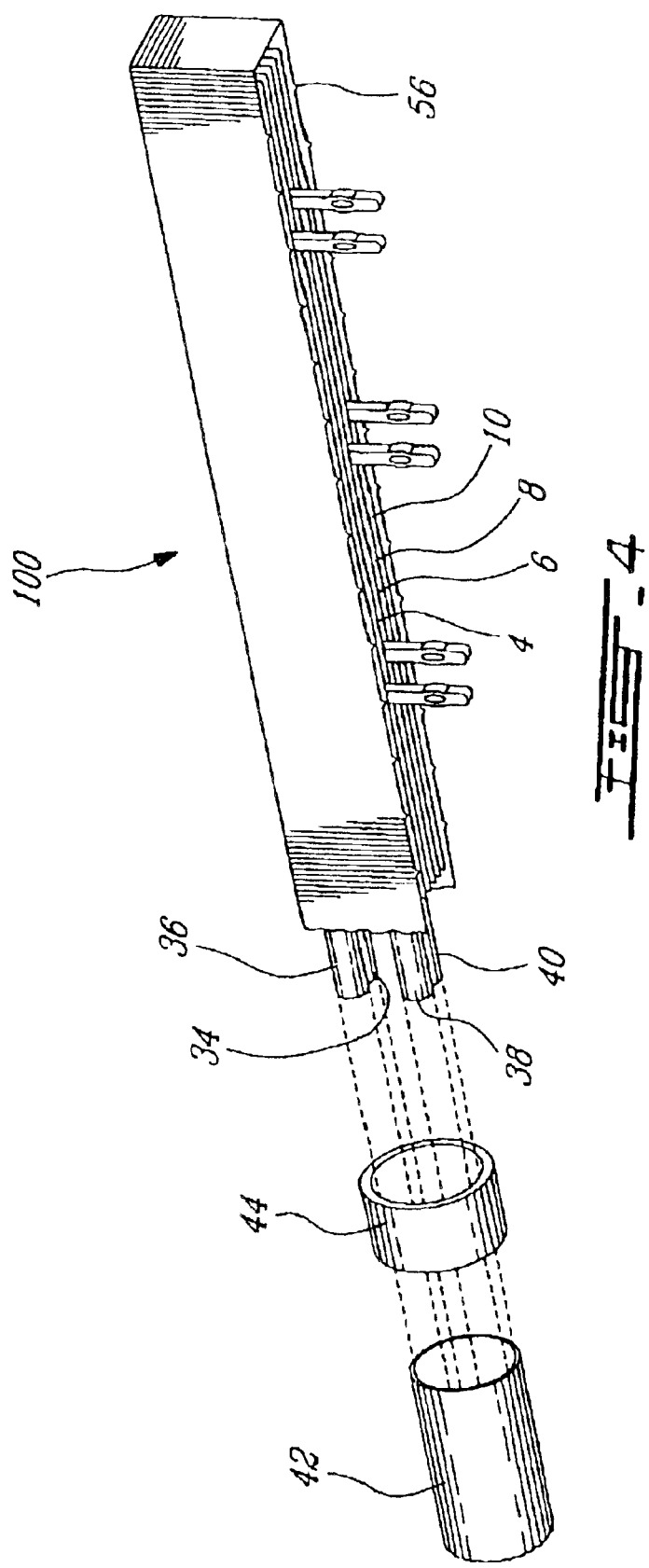

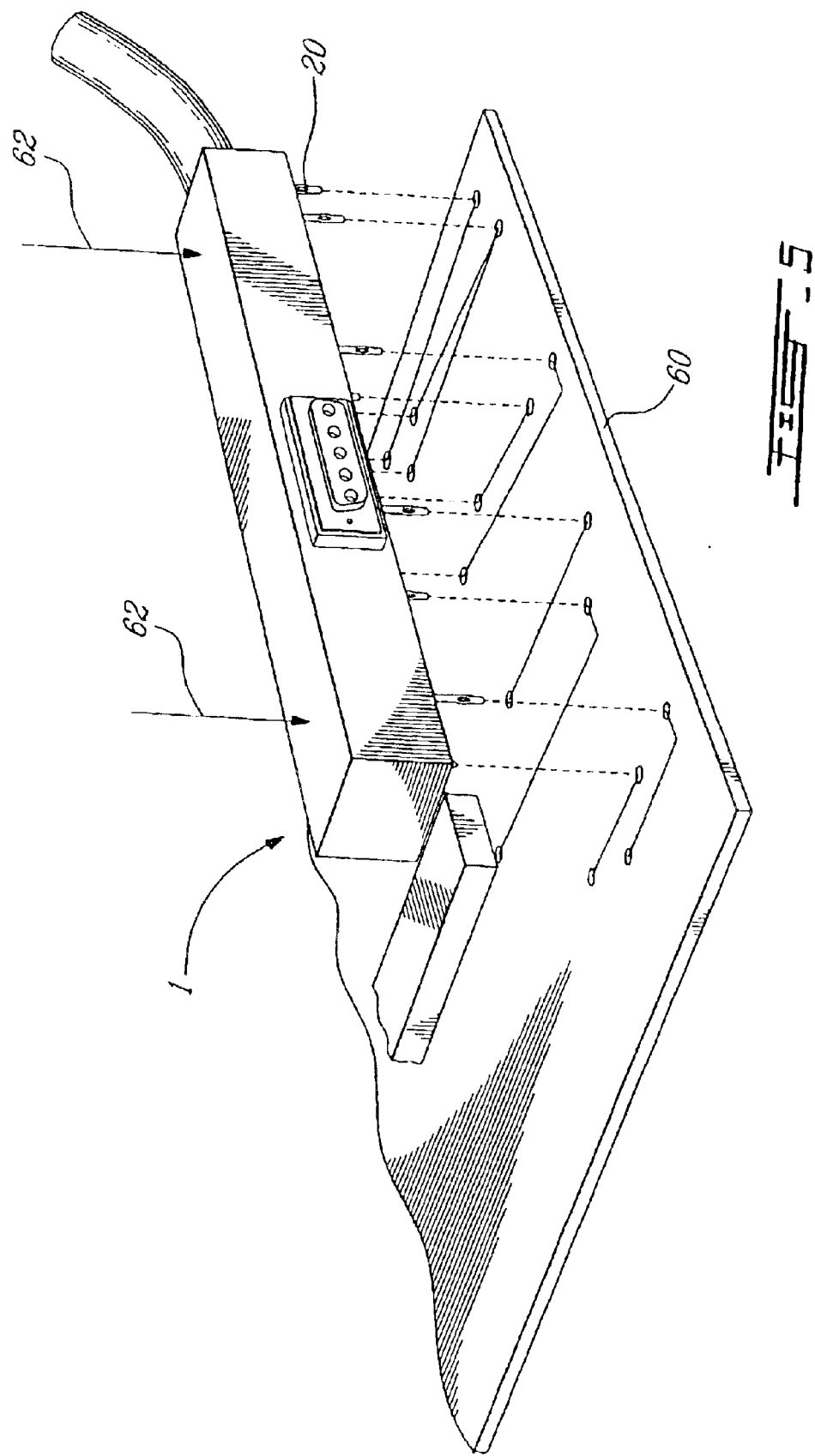

PRESS-FIT BUS BAR DISTRIBUTING POWER

BACKGROUND OF THE INVENTION

1. Field of the Invention

The present invention relates to a conductor assembly, in particular but not exclusively a bus bar used to distribute electric power along for example a backplane (circuit board (typically printed) at the rear of a cabinet wall) or a PCB (Printed Circuit Board).

2. Brief Description of the Current Technology

Many applications make use of a number of electronic circuits, components or devices implementing different technologies and/or operating characteristics, and having various requirements with respect to voltage and current. In such applications, power supply units producing a number of different voltages are exploited.

For a number of reasons, including heating and electromagnetic interference, these power supply units are located off-board, and the multiple connections between the power supply unit and the electronic circuits, components or devices are established through soldered connections, or as is often the case with power distribution to a PCB, via standardised two-part modular plug/socket assemblies.

The above described current methods establish reliable electrical connections between the power supply unit and the supplied circuits, components or devices. These connections, however, are generally limited to a single point of application of each voltage required for the operation of the electronic circuit, component or device. Of course, there are applications where multiple points of application of a given voltage are desirable. Moreover, there exist applications where the point of application of one voltage is isolated from the point of application of another voltage.

Power distribution using bus bars allowing power to be tapped into at any location along the bus bar are well known in the art and are widely used in a variety of electrical power supply applications, including industrial, residential and automotive applications. These bus bars include multi-conductor bus bars for power distribution comprised of a set of bus bar conductors separated by a dielectric insulating material whereby at regular intervals each bus bar is provided with upstanding contact blades allowing for connection to a power take-off assembly. Similar designs include the combination of bus bars and modular receptacle housings which can be installed at any position along the bus bar to provide a power outlet. Also, bus bar systems have been designed with one or more tabs protruding from each bus bar conductor in a predefined pattern to mate with a standardised connector assembly.

SUMMARY OF THE INVENTION

In accordance with the present invention, there is provided an elongated press-fit conductor assembly comprising at least two elongated, generally flat laminated conductors having respective, adjacent longitudinal edges, a layer of electrically insulating material interposed between the two laminated conductors, and a plurality of press-fit contact members extending from the adjacent longitudinal edges of the laminated conductors and distributed along these longitudinal edges for press-fit insertion in respective contact-receiving areas.

These press-fit contact members are capable of being directly inserted in respective contact-receiving areas, for example electrically conductive receptacles such as the plated holes of a backplane or PCB without the need of any other connector assembly.

The present invention also relates to an elongated press-fit conductor assembly comprising a plurality of elongated, generally flat laminated conductors having respective, mutually adjacent longitudinal edges, a layer of electrically insulating material interposed between each pair of adjacent, laminated conductors, and a plurality of press-fit contact members extending from the longitudinal edges of the laminated conductors and distributed along these longitudinal edges for press-fit insertion in respective contact-receiving areas.

In accordance with a preferred embodiment, the contact members comprise press-fit tails, and these press-fit tails comprise eye-of-needle press-fit tails integral with the conductors.

The present invention further relates to an elongated press-fit conductor assembly comprising at least two elongated, generally flat laminated conductors having respective, adjacent longitudinal edges, a layer of electrically insulating material interposed between these two laminated conductors, a plurality of contact members extending from the adjacent longitudinal edges of the laminated conductors, a housing enclosing a sandwich structure formed of the laminated conductors and layer of electrically insulating material and defining opening means through which the contact members extend, and a body of electrically insulating material which fills a cavity between the inner surface of the housing and the sandwich structure.

The housing form a structure to which pressure can be applied to press-fit the contact members of the conductor assembly in the respective contact-receiving areas.

According to preferred embodiments:

- the housing has a U-shaped cross section and the opening means comprise a longitudinal opening along the adjacent longitudinal edges;
- the electrically insulating material of the body comprises epoxy resin;
- the sandwich structure formed of the laminated conductors and layer of electrically insulating material is completely embedded in the body of electrically insulating material, this body forming a wall across the opening means from which the contact members protrude;
- the housing is made of an electromagnetic interference shielding material; and
- the elongated press-fit conductor assembly further comprises (a) a power connector mounted on the housing and comprising a plurality of contacts respectively connected to the laminated conductors, or (b) a power cable comprising a plurality of electric wires respectively connected to the laminated conductors.

In accordance with one aspect of the present invention, an electrical bus bar assembly is provided comprising a plurality of electrical bus bar conductors, each conductor comprising at least two through-hole press-fit contact sections on first sides and at least two protrusions on opposite second sides; electrical insulating material located between the bus bars conductors; and a cap connected to the bus bar conductors and the electrical insulating material. The cap comprises deformable electrical insulating material and is located against ends of the protrusions such that the protrusions can extend into the cap by deformation of the material of the cap as the cap is pressed against the protrusions.

In accordance with another aspect of the present invention, an electrical bus bar assembly is provided comprising a housing comprising layers of electrical insulating material and a cap connected to outer ones of the layers; and a plurality of generally flat electrical bus bars separated by the layers of electrical insulating material. Each bus bar comprises a first edge with a plurality of through-hole, press-fit connection sections. The electrical bus bar assembly can be through-hole mounted to a printed circuit board by the press-fit connection sections.

In accordance with one method of the present invention, a method of assembling an electrical bus bar assembly is provided comprising steps of providing a plurality of elongate electrical bus bars with through-hole, press-fit connection sections extending from a first elongate edge; providing electrically insulating layers between the bus bars; and connecting an elongate cap to the bus bars and the layers, the cap contacting projections on a second opposite elongate edge of the bus bars. When the cap is pressed against the projections, the cap can deform such that at least one of the projections extends into the cap. The cap can deform to compensate for manufacturing tolerances between heights of the projections relative to each other.

The foregoing and other objects, advantages and features of the present invention will become more apparent upon reading of the following non restrictive description of preferred embodiments thereof, given for the purpose of illustration only with reference to the accompanying drawings.

BRIEF DESCRIPTION OF THE DRAWINGS

In the appended drawings:

FIG. 1 is a perspective view of a press-fit bus bar in accordance with a first preferred embodiment of the present invention;

FIG. 2 is a close up, partial view of the bus-bar of FIG. 1;

FIG. 3 is a cross sectional view of the bus bar of FIG. 1, taken along line 3—3;

FIG. 4 is a perspective view of a press-fit bus bar in accordance with a second preferred embodiment of the present invention;

FIG. 5 illustrates application of pressure to press-fit the bus bar in a PCB or backplane;

DETAILED DESCRIPTION OF THE PREFERRED EMBODIMENTS

Figure 6:
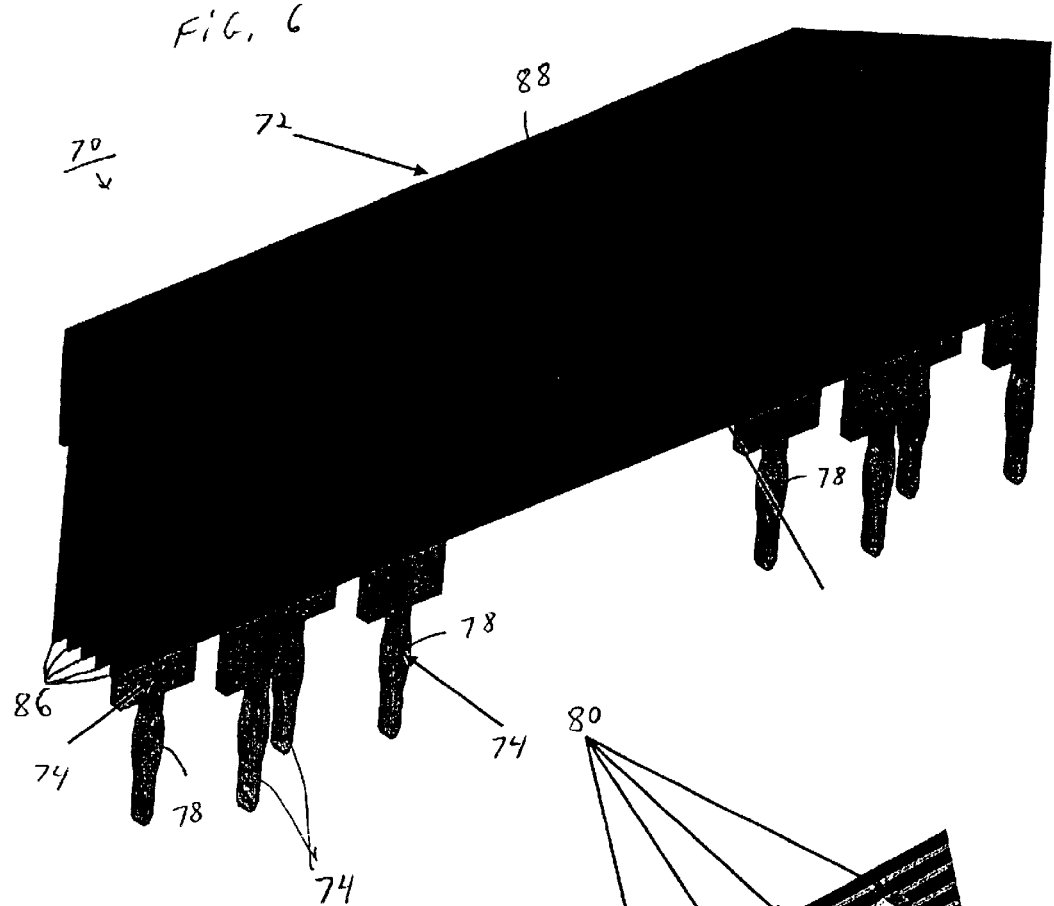
FIG. 6 is a partial perspective view of one end of an alternate embodiment of an electrical bus bar assembly incorporating features of the present invention.
Figure 7:
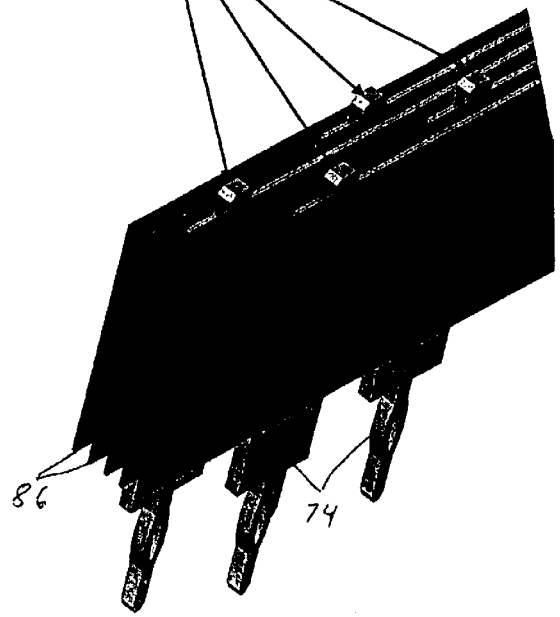
FIG. 7 is a partial perspective view of the end of the assembly shown in FIG. 6 with the cap removed.
Figure 8:
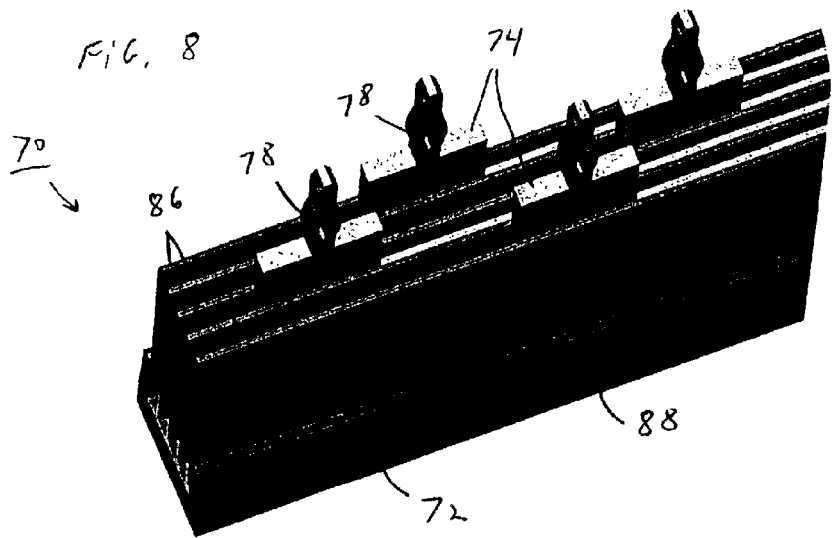
FIG. 8 is a partial perspective view of the bottom side of the end of the assembly shown in FIG. 6.
Figure 9:
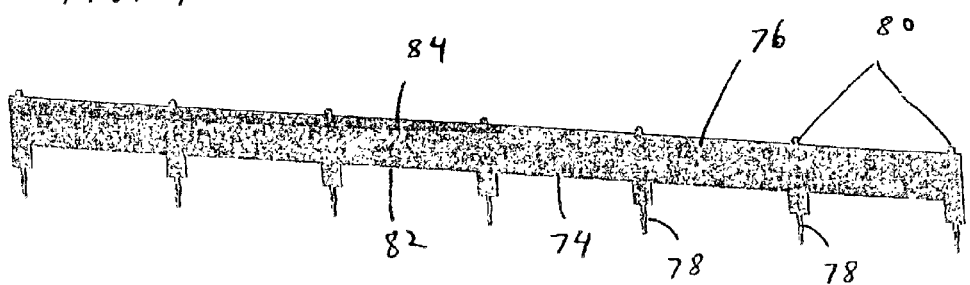
FIG. 9 is a perspective view of one of the bus bar conductors used in the assembly shown in FIG. 6.
Figure 11:
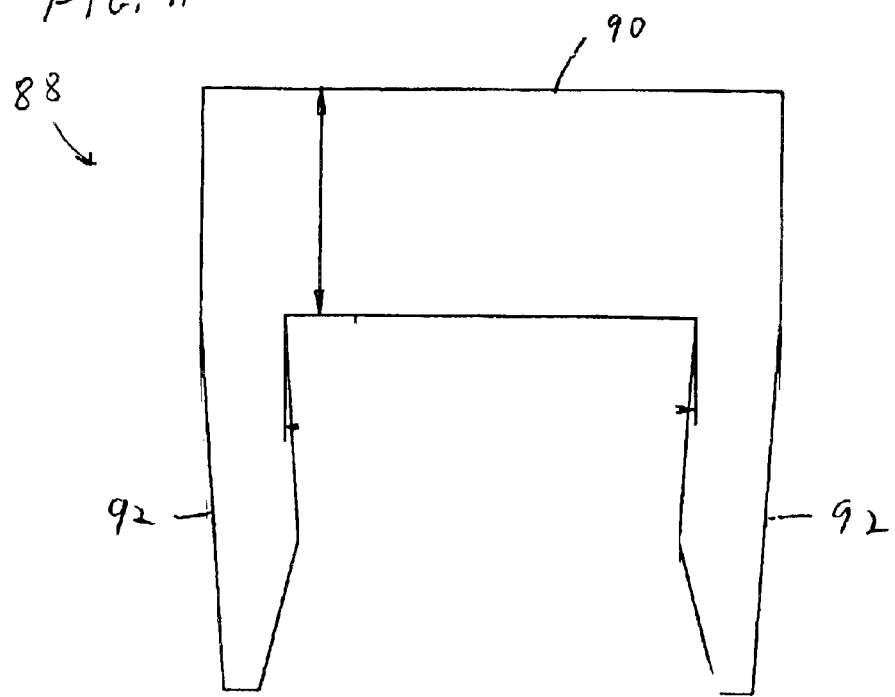
FIG. 11 is an end view of the cap shown in FIG. 10.
Figure 10:
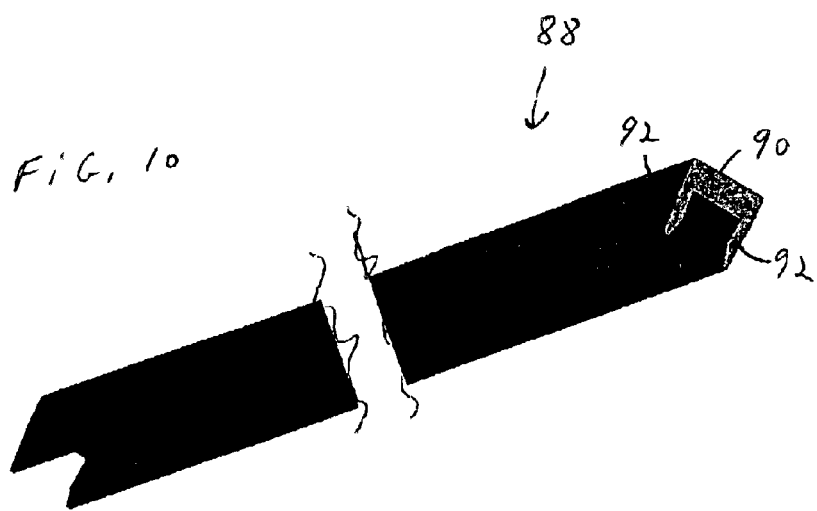
FIG. 10 is a perspective view of the cap used in the assembly shown in FIG. 6.

The invention will now be described with reference to the appended drawings. In these drawings, identical or corresponding elements in the various figures are identified by the same reference numerals.

Although the preferred embodiments of the present invention will be described in relation to a bus bar, those of ordinary skill in the art will appreciate that the same concept can be applied to other types of conductor assemblies.

A press-fit elongate bus bar 1 in accordance with the first preferred embodiment of the present invention is illustrated in FIGS. 1 and 2 of the appended drawings. Bus bar 1 is capable of providing four (4) distinct voltage/current loops and a reference (ground).

The bus bar 1 includes an elongated housing 2 into which are enclosed four (4) elongated, generally flat laminated bus bar conductors 4, 6, 8 and 10. The housing 2 is preferably constructed of a material which shields the bus bar conductors 4, 6, 8 and 10 from electromagnetic interference; this material is typically a conductor of electricity and will advantageously be metallic. Furthermore, when in position on a PCB (Printed Circuit Board) or back-plane, the housing 2 comprises triangular tabs such as 56 which advantageously electrically contact with the surface of the PCB or backplane to maintain ground continuity.

As better seen in FIG. 3, the housing 2 has a U-shaped cross section. More specifically, the elongated housing 2 defines two longitudinal, opposite side walls 46 and 48, and a longitudinal, transversal wall 50 interconnecting the two side walls 46 and 48. The face of the housing 2 opposite to the transversal wall 50 is open to define a longitudinal opening 52.

Still referring to FIG. 3, bus bar conductor 4 is separated from adjacent bus bar conductor 6 by a layer 12 of electrically insulating dielectric material 12, bus bar conductor 6 is separated from adjacent bus bar conductor 8 by a layer 14 of electrically insulating dielectric material, and bus bar conductor 8 is separated from adjacent bus bar conductor 10 by a layer 16 of electrically insulating dielectric material. This forms a multi-layer sandwich structure of alternating laminated bus bar conductors and dielectric layers.

The sandwich structure formed by the laminated bus bar conductors 4, 6, 8 and 10 and dielectric layers 12, 14 and 16 is preferably held within the housing 2 by a body of electrically insulating material such as an epoxy resin 18 poured in the cavity between the inner surface of the housing 2 and the sandwich structure and subsequently hardened. It should be noted here that the bus bar conductors 4, 6, 8 and 10 and the dielectric layers 12, 14 and 16 are then parallel to the opposite side walls 46 and 48 of the housing 2. Also, the longitudinal edges of the bus bar conductors 4, 6, 8 and 10 and the dielectric layers 12, 14 and 16 adjacent to the longitudinal opening 52 are, in the illustrated example, completely embedded in the hardened epoxy resin 18. The longitudinal opening 52 of the housing 2 is therefore closed by a flat wall 54 of epoxy resin 18 generally perpendicular to the side walls 46 and 48, and to the bus bar conductors 4, 6, 8 and 19 and the dielectric layers 12, 14 and 16.

One or more contact members in the form of press-fit tails 20 protrudes through the flat epoxy wall 54 from the adjacent edge of each bus bar conductor 4, 6, 8 and 10. In the illustrated first preferred embodiment, the press-fit tails 20 are eye-of-needle press-fit tails integral with the electrically conductive material forming the bus bar conductors 4, 6, 8 and 10. The press-fit tails 20 protrude from the flat epoxy wall 54 to an extent suitable for press-fit insertion into any suitable contact receiving area (for example an electrically conductive receptacle such as a plated hole of a PCB or backplane). As shown in FIG. 5, the press-fit tails 20 can be inserted in metal-plated holes (or any other suitable type of contact-receiving area) of a PCB or backplane 60. Just a word to mention that a press (not shown) may be required to apply sufficient pressure 62 to the housing 2 of the bus bar 1 so as to insert the press-fit tails 20 in the plated holes such as 64 of the PCB or backplane 60.

In the first preferred embodiment, each bus bar conductor 4, 6, 8 and 10 and the corresponding press-fit tails 20 are integrally made from a single piece of sheet metal such as copper or aluminium.

For particular applications, each bus bar conductor such as 4, 6, 8 and 10 may potentially be equipped with more than one press-fit tail such as 20; this is the case for the preferred embodiment of the bus bar as illustrated in FIG. 1. On the other hand, the number and positioning of the press-fit tails 20 of the bus bar conductors such as 4, 6, 8 and 10 can be designed for each particular application. For example, in a given application, the same voltage/current loop can be used to supply two electrical/electronic components located at opposite ends of a PCB. For example, a first press-fit tail would then be located at one end of a bus bar conductor while a second press-fit tail would then be located at the opposite end of the same bus bar conductor, both in mutual electrical contact through the bus bar conductor and supplying the same voltage/current loop.

Alternatively, as shown in FIG. 1, each bus bar conductor 4, 6, 8 and 10 can be fabricated with a number of equally spaced apart press-fit tails 20. Depending on the application, the press-fit tails which are not required can be removed from the bus bar, either through cutting or by twisting and snapping the press-fit tails off. In this manner only those press-fit tails required for a given application are left to provide contact between the bus bar conductor and the PCB, backplane or any other component or device requiring electrical power.

The number, locations and spacing of the press-fit tails are not limited and can be easily adapted to customers' needs and requirements.

Furthermore, it should be pointed out to those of ordinary skill in the art that the use of eye-of-needle press-fit tails represent only a preferred embodiment, and that these eye-of-needle press-fit tails could be replaced by any other suitably shaped press-fit contact pins or tabs fabricated from an electrically conductive material for insertion into a PCB, back plane or any other component or device requiring electrical power.

A power input connector 22 (FIGS. 1 and 2) is mounted on the side of the elongated housing 2 and is used to supply electric power (voltage and current) from a power supply module (not shown) to the bus bar conductors 4, 6, 8 and 10 of the bus bar 1. In the preferred embodiment illustrated in FIGS. 1–3, the power input connector 22 is a five (5) receptacle D-Sub female connector connectable to a five (5) pin D-Sub male connector (not shown) attached to a multiconductor cable (not shown) leading to an external power supply module (not shown).

The connector 22 is comprised of five (5) contact receptacles 24, 26, 28, 30 and 32. The bus bar conductors 4, 6, 8 and 10 are electrically connected to four (4) of the five (5) contact pins 24, 26, 28, 30 and 32, respectively, in conventional manner well known to those of ordinary skill in the art. Also, in the preferred embodiment of FIGS. 1–3, the housing 2 is in electrically conductive contact with the remaining one of the five (5) contact pins 24, 26, 28, 30 and 32 to adequately shield the bus bar conductors enclosed in this housing 2 from electromagnetic interference. Also, the skirting 58 of the D-Sub connector 22 is in electrical contact with the shielding housing 2, again to ensure ground continuity.

Referring now to FIG. 4 of the appended drawings, a second alternative embodiment 100 of the bus bar in accordance with the present invention is illustrated in a partially exploded view, wherein a conductive cable, comprising four (4) electrically conductive wires 34, 36, 38 and 40 and shielding jacket 42, is used to connect the bus bar conductors 4, 6, 8 and 10 to an external power supply module (not shown). Wires 34, 36, 38 and 40 exit from one end of the housing 2 wherein a suitable exit for the wires has been made. Each wire 34, 36, 38 and 40 is an insulated wire and is in electrically conductive contact with a respective one of the bus bar conductors 4, 6, 8 and 10.

The shielding jacket 42 is preferably braided and manufactured from an electrically conductive material such as copper or aluminium or any other suitable electrically conductive material. Jacket 42 is attached to and held in electrically conductive contact with the housing 2 via a conductive fitting 44. By connecting the metallic braided shielding jacket 42 to the elongated housing 2, ground continuity is ensured.

Although the present invention has been described hereinabove by way of preferred embodiments of bus bars comprising four (4) bus bar conductors, it will be apparent to those of ordinary skill in the art that a single bus bar conductor or any other number of laminated bus bar conductors could be provided for.

Also, although the above described preferred embodiments of the present invention relate to bus bars, the present invention can be extended to a multi-conductor laminated assembly, wherein each conductor is electrically insulated from each other or possibly with some of the conducted shunted together. As described hereinabove, use of an outer metallic (or made of other electrically conductive material) shell can be contemplated for EMI shielding and for providing a surface usable to press the multi-conductor assembly to, for example, a PCB or backplane. Finally different power input options should also be considered, either a cable in the top or any of the sides (as described in the foregoing description) or through a connector on the top (as described in the foregoing description) or any of the sides.

Referring now to FIGS. 6–12, another alternate embodiment of the present invention will be described. The electrical bus bar assembly 70 generally comprises a housing 72 and electrical bus bar conductors 74. In the embodiment shown, the assembly 70 does not comprise a connector (such as connector 22 shown in FIG. 1) or wires (such as wires 34, 36, 38 and 40 shown in FIG. 4) which connect the assembly directly to a power supply located off of the printed circuit board. Instead, the bus bar assembly 70 is provided to connect various traces on a printed circuit board to each other. Thus, the bus bar assembly 70 can be used to provide additional conductor paths for a printed circuit board. Also in the embodiment shown, the bus bar assembly 70 does not comprise an exterior shell, such as the electrically conductive housing 2 shown in FIG. 1.

The assembly 70 comprises four of the bus bar conductors 74. However, in alternate embodiment, more or less than four of the bus bar conductors could be provided. The conductors 74 are preferably comprised of stamped electrically conductive material, such as copper alloy having a thickness of about 0.5 mm. The conductors 74 can be plated, such as with Ni/Sn plating. The bus bar conductors 74 are substantially identical to each other. The conductors 74 are offset at different offset lengths from the ends of the housing 72. However, in alternate embodiments, one or more of the bus bar conductors could be different from the other bus bar conductors and, the conductors 74 might not be staggered at the ends of the housing.

Each bus bar conductor 74 generally comprises a main section 76, through-hole press-fit contact sections 78 and projections 80. In the embodiment shown, each bus bar conductor 74 comprises a substantially flat, elongate and straight stamped metal member. However, in alternate embodiments, each bus bar conductors 74 could comprise an alternative shape, such as an angled shape. The through-hole press-fit contact sections 78 extend from a first elongate bottom edge 82. The contact sections 78 comprise an "eye-of-the-needle" press-fit contact section. The contact sections 78 can be inserted into holes in a printed circuit board. The contact sections 78 can mount the assembly 70 to the printed circuit board. Each bus bar conductor 74 has a plurality of the contact sections 78.

The projections 80 extend from an opposite second elongate top edge 84. Each bus bar conductor 74 has a plurality of the projections 80. The projections 80 are aligned with respective ones of the contact sections 78. Thus, force pressing against the tops of the projections 80 can be transmitted in a direct line to the contact sections 78. The projections 80 are preferably staggered relative to the other bus bar conductors in order to prevent any type of short circuiting. The height of the bus bar conductors 74, and thus the height of the assembly 70, is dictated by the desired current capacity of the assembly 70. The number of press-fit tails can also determine the level of current carrying capacity.

The housing 72 generally comprises layers of electrically insulating material 86 and a cap 88. The layers of electrically insulating material 86 are located between the bus bar conductors 74 and are located on the outer elongate sides of the assembly 70. The layers 86 can be formed before assembly with the conductors 74 or, alternatively, molded onto the conductors 74 as a single member. In a preferred embodiment, the electrically insulating material 86 is comprised of thermoplastic epoxy. Other materials could alternatively be used. One example is polyimide film, such as Kapton tape. In one embodiment, the layers 86 are provided having a thickness of about 0.13 mm and could comprise adhesive on one side (for the external layers) or two sides (for the internal layers). In an alternate embodiment, the conductors 74 could float or be movable relative to the layers 86.

The cap 88 is preferably comprised of an extruded plastic or polymer member. The cap 88 generally comprises a cross sectional inverted U shape comprising a top 90 and two legs 92. As shown best in FIG. 11, the two legs 92 are tapered inwardly towards each other. As shown best in FIG. 12, when the cap 88 is attached to the conductors 74 and layers 86, the legs 92 are resiliently deflected outwardly. The legs 92 form a clamp therebetween for clamping portions of the conductors 74 and layers 86. The cap 88 can electrically insulate the top sides of the conductors 74.

The plastic or polymer material used to form the cap 88 is preferably a slightly deformable material. When the bus bar assembly 70 is being connected to a printed circuit board, the assembly 70 must be pushed downward by a force against its cap 90 to force the contact sections 78 into holes of the printed circuit board. During assembly of the bus bar conductors 74 with the layers 86, the conductors 74 might not be perfectly vertically orientated relative to each other. Thus, the contact sections 78 might be vertically offset from each other. This vertical offset also results in a vertical offset at the top edges of the conductors 74. The cap 88 has been provided to compensate, at least partially, for this vertical offset and to compensate for manufacturing tolerances.

Figure 12:
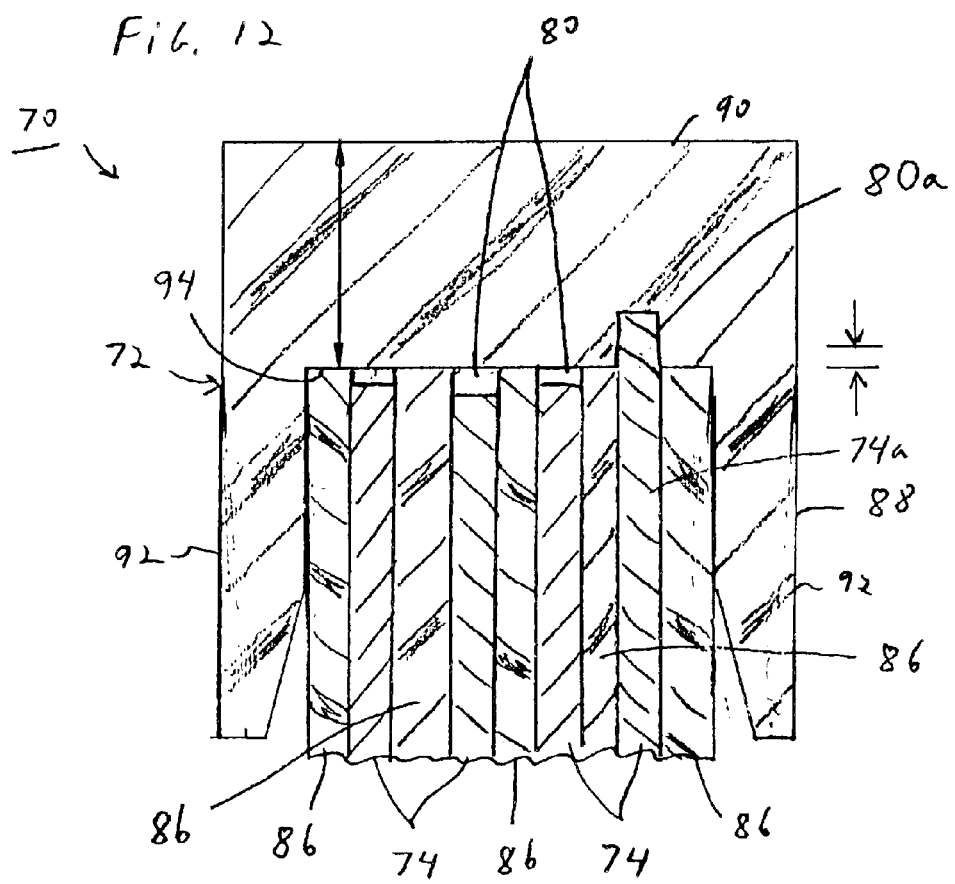
FIG. 12 is a cross-sectional view of the assembly shown in FIG. 6.

As seen in FIG. 12, when the cap 90 is pressed downward against the conductors 74, the bottom edge 94 presses directly against the top sides of the projections 80. For a bus bar conductor which is vertically higher than the other bus bar conductors, such as bus bar conductor 74a shown in FIG. 12, its projection 80a can extend into the material of the top 90 of the cap 88 with the material of the cap 88 being deformed thereat. Thus, the cap 90 can compensate for tolerances in the vertical alignment of the conductors 74 relative to each other, but nonetheless provide a rigid enough member to be used to press the assembly 70 into connection with the printed circuit board by through-hole press-fit mounting of the contact section 78 into the holes. This can insure that all the contact sections 78 are properly inserted into their respective holes in the printed circuit board.

By manufacturing the cover 88 as an extruded member, the cover 88 is relatively easy and less expensive to manufacture than other types of covers or housings. The cover 88 can be merely cut to any suitable length as desired. However, in alternate embodiments, any suitable method could be used to manufacture the cover. By allowing the legs 92 to provide an interference fit or friction mounting with the other members of the assembly, assembly of the assembly 70 is relatively easy, fast and inexpensive to manufacture. Because the cap 88 can compensate for vertical height differences and tolerances, the vertical height tolerance among the conductors 74 can be increased. This can allow for faster and less expensive manufacturing of the assembly 70 than previously available.

In an alternate embodiment, the assembly 70 could comprise a connector or wires similar to the embodiments shown in FIGS. 1 and 4 for connecting the bus bar assembly to a power supply. In an alternate embodiment, the bus bar assembly 70 could comprise an additional electrically conductive exterior shell or housing member. In an alternate embodiment, any suitable type of electrically conductive material or thickness could be provided for the bus bar conductors 74. In an alternate embodiment, any suitable type of press-fit contact section could be provided.

While the invention has been described hereinabove with reference to preferred embodiments thereof, it will be apparent to those of ordinary skill in the art that various changes and modifications can be made and equivalents employed, without departing from the present invention as defined by the appended claims.

What is claimed is:

1. An elongated press-fit conductor assembly comprising:
    a plurality of elongated, generally flat laminated conductors having respective, mutually adjacent longitudinal edges;
    a layer of electrically insulating material interposed between each pair of adjacent, laminated conductors;
    a plurality of press-fit contact members extending from the longitudinal edges of the laminated conductors and distributed along said longitudinal edges for press-fit insertion in respective contact-receiving areas; and
    a housing enclosing at least a portion of a sandwich structure formed of said laminated conductors and said layers of electrically insulating material, said housing comprising a section with a general U shaped cross-section, wherein legs of said U-shaped cross-section apply a clamping force to opposite sides of said sandwich structure, and wherein a top of said U shaped section covers opposite edges of said conductors located on an opposite side of conductors from said longitudinal edges.

2. The elongated press-fit conductor assembly of claim 1 wherein said contact members comprise press-fit tails integral with the laminated conductors.

3. The elongated press-fit conductor assembly of claim 2, wherein said press-fit tails comprise eye-of-needle press-fit tails.

4. An electrical bus bar assembly comprising:

a plurality of electrical bus bar conductors, each conductor comprising at least two through-hole press-fit contact sections on first sides and at least two protrusions on opposite second sides;

electrical insulating material located between the bus bars conductors; and a cap connected to the bus bar conductors and the electrical insulating material, wherein the cap comprises deformable electrical insulating material and is located against ends of the protrusions such that the protrusions can extend into the cap by deformation of the material of the cap as the cap is pressed against the protrusions.

5. An electrical bus bar assembly as in claim 4 wherein the deformable electrical insulating material of the cap comprises extruded plastic or polymer material.

6. An electrical bus bar assembly as in claim 5 wherein the electrical insulating material located between the bus bar conductors comprises epoxy material.

7. An electrical bus bar assembly as in claim 4 wherein the cap comprises a general cross sectional inverted U shape with outer legs tapered inward towards each other.

8. An electrical bus bar assembly as in claim 7 wherein the cap clamps portions of the electrical bus bar conductors and electrical insulating material located between the bus bar conductors against each other by the outer legs of the cap.

9. An electrical bus bar assembly as in claim 4 wherein the electrical bus bar conductors comprise generally flat elongate members, and wherein the protrusions are longitudinally offset relative to each other among different ones of the electrical bus bar conductors.

10. An electrical bus bar assembly as in claim 4 wherein the cap comprises means for clamping the electrical bus bar conductors and electrical insulating material located between the bus bar conductors together.

11. An electrical bus bar assembly comprising:

a housing comprising layers of electrical insulating material and a cap connected to outer ones of the layers; and a plurality of generally flat electrical bus bars separated by the layers of electrical insulating material, each bus bar comprising a first edge with a plurality of through-hole, press-fit connection sections, wherein the electrical bus bar assembly can be through-hole mounted to a printed circuit board by the press-fit connection sections, wherein the cap is comprised of deformable plastic material, and wherein the bus bars each comprise a second opposite edge with a plurality of projections, at least one of the projections projecting into the cap with the plastic material of the cap deforming thereat.

12. A method of assembling an electrical bus bar assembly comprising steps of:

providing a plurality of elongate electrical bus bars with through-hole, press-fit connection sections extending from a first elongate edge;

providing electrically insulating layers between the bus bars; and connecting an elongate cap to the bus bars and the layers, the cap contacting projections on a second opposite elongate edge of the bus bars, wherein, when the cap is pressed against the projections, the cap deforms such that at least one of the projections extends into the cap, wherein the cap deforms to compensate for manufacturing tolerances between heights of the projections relative to each other.

13. A method as in claim 12 further comprising providing the cap as an extruded plastic or polymer member.

14. A method as in claim 12 further comprising the cap clamping the bus bars and the insulating layers together between opposite deflectable legs of the cap.

* * * * *